(12) United States Patent
Frosien

(10) Patent No.: US 7,592,590 B2
(45) Date of Patent: Sep. 22, 2009

(54) CHARGED PARTICLE BEAM DEVICE WITH DETECTION UNIT SWITCH AND METHOD OF OPERATION THEREOF

(75) Inventor: Jüergen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 387 days.

(21) Appl. No.: 10/550,177

(22) PCT Filed: Mar. 18, 2004

(86) PCT No.: PCT/EP2004/002841

§ 371 (c)(1),
(2), (4) Date: Jun. 12, 2006

(87) PCT Pub. No.: WO2004/086452

PCT Pub. Date: Oct. 7, 2004

(65) Prior Publication Data

US 2006/0255268 A1    Nov. 16, 2006

(30) Foreign Application Priority Data

Mar. 24, 2003  (EP) .................................. 03006716

(51) Int. Cl.
*H01J 37/30* (2006.01)
(52) U.S. Cl. ........................ 250/310; 250/397; 250/398; 250/396 R; 250/396 ML
(58) Field of Classification Search ................... 250/310
See application file for complete search history.

(56) References Cited

U.S. PATENT DOCUMENTS 3,714,422 A     1/1973  Okano et al.
4,803,357 A *   2/1989  Brust ......................... 250/310
5,578,821 A    11/1996  Meisberger et al.
5,608,218 A *   3/1997  Sato et al. .................... 250/310
5,894,124 A *   4/1999  Iwabuchi et al. ............. 250/310
6,274,877 B1 *  8/2001  Muraki .................. 250/492.23
6,555,816 B1 *  4/2003  Sawahata et al. ............. 250/310
6,583,414 B2 *  6/2003  Nozoe et al. ................. 250/310
6,852,974 B2 *  2/2005  Kochi et al. .................. 250/311
7,038,226 B2 *  5/2006  Ono et al. ................. 250/492.3

(Continued)

FOREIGN PATENT DOCUMENTS

JP       06188294       7/1994

(Continued)

OTHER PUBLICATIONS

PCT International Search Report and Written Opinion for PCT/EP2004/002841, dated Dec. 8, 2004.

(Continued)

*Primary Examiner*—David A. Vanore
(74) *Attorney, Agent, or Firm*—Patterson & Sheridan, L.L.P.

(57) ABSTRACT

The invention provides a charged particle beam device and a method of operation thereof. An emitter (2) emits a primary charged particle beam (12). Depending on the action of a deflection system, which comprises at least three deflection stages (14), it can be switched between at least two detection units (16, 44). Further, beam shaping means (15; 41) is provided and a lens for focusing at the primary charged particle beam on a specimen.

16 Claims, 12 Drawing Sheets

U.S. PATENT DOCUMENTS

| | | | |
|---|---|---|---|
| 7,230,252 B2 * | 6/2007 | Muraki et al. | 250/396 R |
| 7,244,933 B2 * | 7/2007 | Nakasuji et al. | 250/307 |
| 7,276,707 B2 * | 10/2007 | Iwasaki et al. | 250/396 R |
| 7,355,177 B2 * | 4/2008 | Kamiya et al. | 250/311 |
| 7,425,714 B2 * | 9/2008 | Sakakibara et al. | 250/492.22 |
| 2002/0088941 A1 | 7/2002 | Yonezawa | |

FOREIGN PATENT DOCUMENTS

| | | |
|---|---|---|
| JP | 09055181 | 2/1997 |
| JP | 10214586 | 8/1998 |

OTHER PUBLICATIONS

Japanese Office Action issued Dec. 17, 2008 in JP 2006-504732.

* cited by examiner

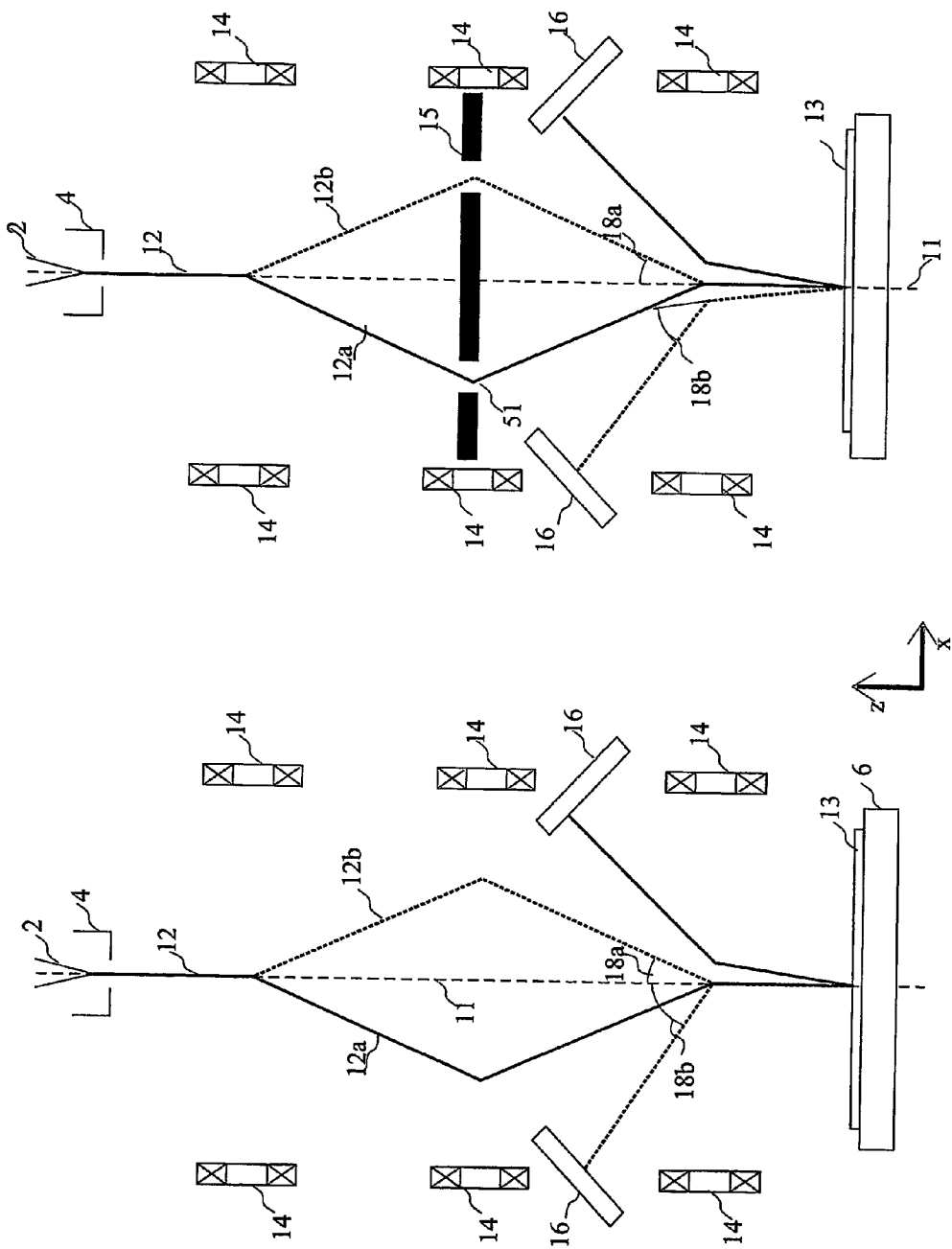

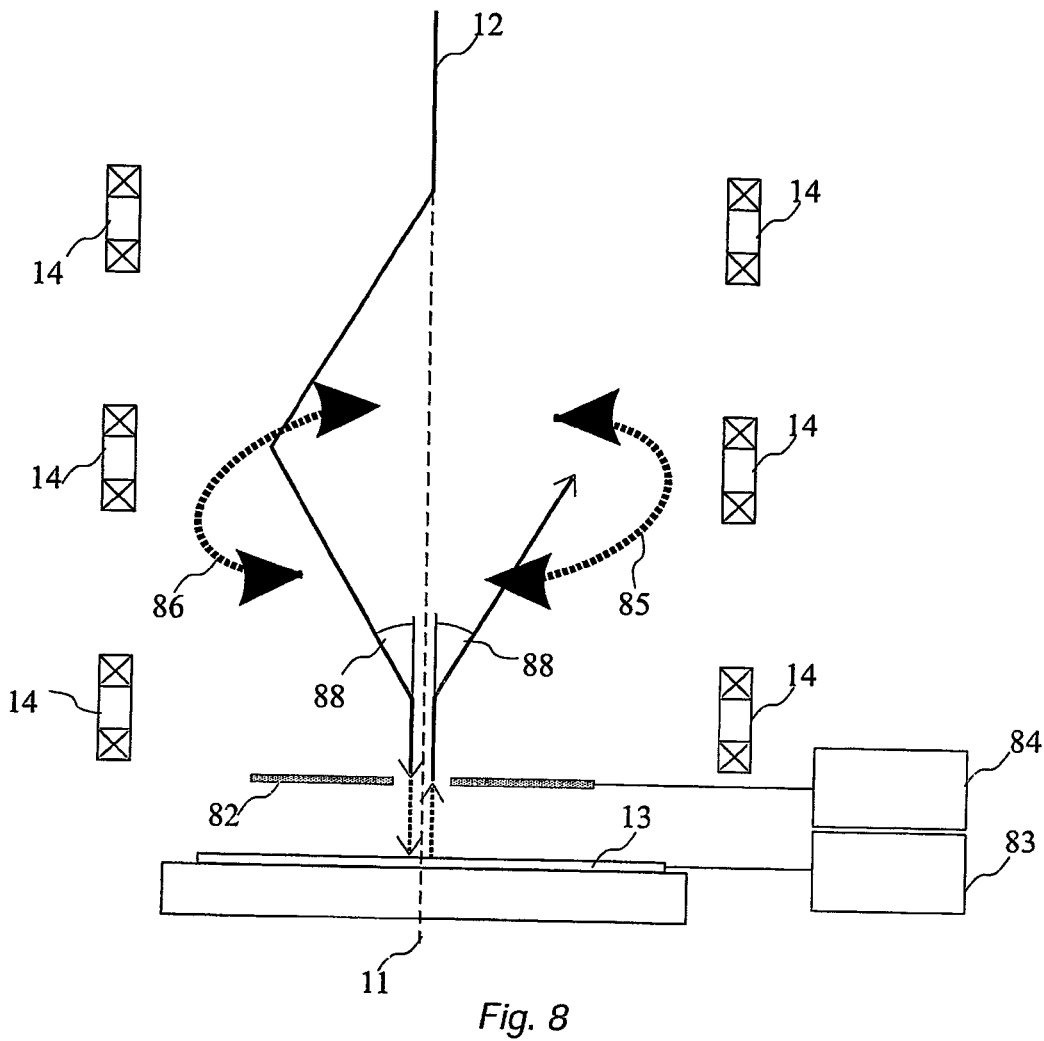
*Fig. 8*
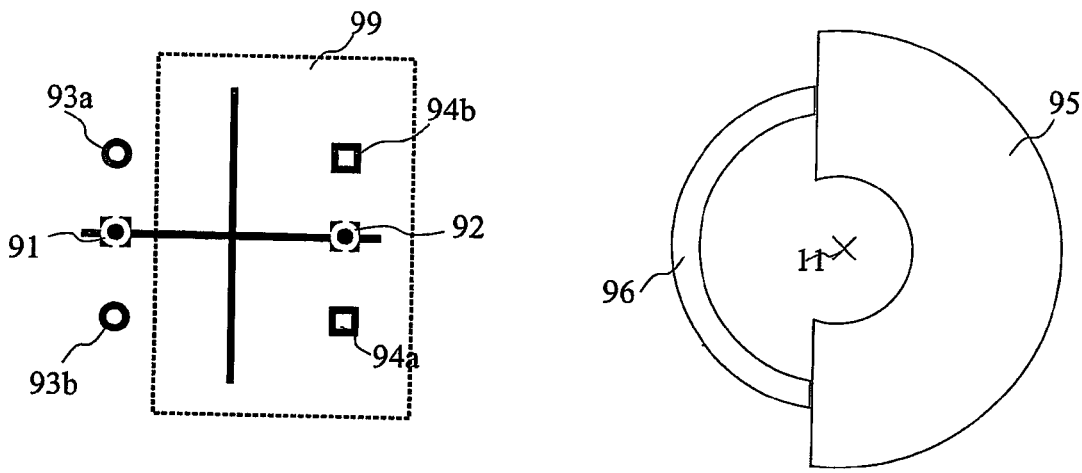
*Fig. 9a*  *Fig. 9b*

CHARGED PARTICLE BEAM DEVICE WITH DETECTION UNIT SWITCH AND METHOD OF OPERATION THEREOF

FIELD OF THE INVENTION

The invention relates to a charged particle beam device for inspection system applications, testing system applications, lithography system applications and the like. It also relates to methods of operation thereof. Further, the present invention relates to a charged particle beam device with a plurality of charged particle beams. Specifically, it relates to a charged particle beam device, a method for imaging a specimen and a multiple charged particle beam device.

BACKGROUND OF THE INVENTION

Charged particle beam apparatuses are used in a plurality of industrial fields. Inspection of semiconductor devices during manufacturing, exposure systems for lithography, detecting devices and testing systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices such as electron microscopes or electron beam pattern generators. Charged particle beams offer superior spatial resolution compared to, e.g. photon beams due to their short wavelengths.

Generally, charged particle beam devices are operated under vacuum conditions to avoid, e.g. ionization of surrounding gases. An insufficient vacuum leads e.g. to formation of hydrocarbons, which can accumulate at apertures and other components. A deposition of these hydrocarbons can restrain the functionality of components, as e.g. detectors or of apertures.

For this and other reasons, maintenance of charged particle devices is frequently required. However, especially for online inspection systems or other systems used within a production line, the availability of devices is a key issue. Thus, the system throughput can be increased if the maintenance time or the maintenance frequency is decreased.

Since there is a strong requirement for increasing the throughput of charged particle beam devices and decreasing the costs for production lines, state of the art devices should be further improved.

SUMMARY OF THE INVENTION

The present invention intends to provide an improved charged particle beam device. Thereby, a decreased maintenance frequency and increased product flexibility is intended to be provided. According to aspects of the present invention, a charged particle beam device according to independent claims 1 and 20 is provided. Further, a method of imaging a specimen according to independent claim 15 and a multiple charged particle device according to independent claim 18 is provided.

According to one aspect of the present invention, a charged particle beam device is provided. The device comprises a charged particle beam emitter, which emits a primary charged particle beam. The charged particle beam device further comprises two detection units for detecting secondary particles and/or backscattered particles emitted on impingement of the primary charged particle beam. Each of the two detection units is associated with a first or a second beam path. Additionally, a deflection system for deflecting the primary charged particle beam and specimen-released charged particles is provided. The deflection system comprises three deflection stages whereby one of the three deflection stages is closer to a specimen stage than the two detection units. Thereby, the primary charged particle beam and specimen-released charged particles are separated and one of the two detection units can be selected.

Within the context of this invention it is understood that a reference to a first or second beam path might also be understood as having more than two beam paths. Thereby, the number of components associated with the beam paths is increased accordingly.

According to a further aspect, a charged particle beam device, comprising a charged particle emitter for emitting a primary charged particle beam; a deflection system, comprising at least three deflection stages, whereby the deflection system is arranged for deflecting the primary charged particle beam and specimen-released charged particles along at least a first or a second beam path; and at least two detection units, each associated with one of the at least first or second beam path, so that the deflection system is adapted to switch between the at least two detection units, whereby one of the at least three deflection stages is closer to a specimen stage than the two detection units.

Within this application, the term specimen-released charged particles is to be understood as charged particles which are detected to generate the measurement signal. Preferably, these are secondary charged particles and/or backscattered charged particles.

Due to the possibility to select one of several detection units, a detection unit that is malfunctioning due to extensive use or due to contamination of the detection unit surface does not have to be replaced immediately. Since maintenance, including venting the system, cleaning or replacing of the detection unit and evacuating the system, can be postponed, the system availability can be increased. Alternatively or additionally, the system can be used for implementing different types of detection units. Thus, the device can be run in more than one mode of operation.

According to a further aspect a charged particle beam device is provided. The device comprises a charged particle beam emitter, which emits a primary charged particle beam. The charged particle beam device further comprises at least two detection units for detecting specimen-released charged particles emitted on impingement of the primary charged particle beam. Additionally, a deflection system for deflecting the primary charged particle beam and specimen-released charged particles is provided. The deflection system comprises three deflection stages. Further, a beam shaping means in the form of a multi-aperture comprising a disc with two apertures is provided. Each aperture of the two apertures corresponds to one of the two detection units. The deflection system is adapted to select an aperture for the charged particle beam and to select the corresponding one of the two detection units for the specimen-released charged particles.

According to a further aspect, a charged particle beam device, comprising a charged particle emitter for emitting a primary charged particle beam; a deflection system, comprising at least three deflection stages, whereby the deflection system is arranged for deflecting the primary charged particle beam and specimen-released charged particles along at least a first or a second beam path; and at least two detection units, each associated with one of the at least first or second beam path, so that the deflection system is adapted to switch between the at least two detection units, whereby one of the at least three deflection stages is closer to a specimen stage than the two detection units. The charged particle device further comprises an aperture unit for shaping the charged particle beam, whereby the aperture unit is a multi-aperture unit comprising at least two apertures; whereby each aperture of the at least two apertures is associated with one of the at least first or second beam path so that the deflection system is adapted to switch between the at least two apertures and a corresponding detection unit of the at least two detection units.

According to a further aspect, the deflection system of the charged particle beam device comprises at least six dipole deflectors, whereby the deflection system is arranged for deflecting the primary charged particle beam and the specimen-released charged particles in two dimensions.

Thereby, additionally to the above-mentioned improvement, a contaminated aperture, e.g. due to an accumulation of hydrocarbons within the beam shaping opening, can be avoided by switching to a further aperture. Thus, good system condition can be regained without maintenance.

According to a further aspect of the present invention a charged particle beam device is provided. The device comprises a charged particle beam emitter, which emits a primary charged particle beam. The charged particle beam device further comprises at least two detection units for detecting specimen-released charged particles emitted on impingement of the primary charged particle beam. Additionally, a deflection system for deflecting the primary charged particle beam and specimen-released charged particles in two dimensions is provided. The deflection system comprises three deflection stages. Thereby, the primary charged particle beam and the specimen-released charged particles are separated and one of the at least two detection units can be selected.

A deflection stage within this application is to be understood as containing at least one deflector acting in one dimension. However, a deflection stage can comprise more than one deflector, which also allows deflection in two dimensions. Thereby, a deflection stage can be provided as a multipole, preferably a quadrupole or an octupole.

Due to the two-dimensional separation, switching between two operation modes or two detection units can be achieved irrespective of the deflection angles of the primary charged particle beam and the specimen-released charged particles.

According to a further aspect of the present invention, a method is provided. Thereby, a primary charged particle beam is deflected away from a optical axis using a first, preferably magnetic deflector of a deflection system and afterwards it is deflected towards the optical axis using a second, preferably magnetic deflector of a deflection system. Using a third magnetic deflector, the primary charged particle beam is redirected to travel substantially along the optical axis. By focusing the primary charged particle beam on a specimen charged particles are released. The third magnetic deflector deflects the specimen-released charged particles. Thereby the third magnetic deflector is controlled such that one detection unit of at least two detection units is selected.

According to an even further aspect of the present invention, a further method is provided. Thereby, a primary charged particle beam is deflected away from an optical axis using a first, preferably magnetic deflector of a deflection system and afterwards it is deflected towards the optical axis using a second, preferably magnetic deflector of a deflection system. The first and the second deflectors are controlled such that an aperture of at least two apertures of a multi-aperture unit is selected. Using a third magnetic deflector, the primary charged particle beam is redirected to travel substantially along the optical axis. By focusing the primary charged particle beam on a specimen, secondary and/or backscattered charged particles are released by the specimen. The third magnetic deflector deflects the specimen-released charged particles. Thereby the third magnetic deflector is controlled such that one detection unit, which corresponds to one of the apertures of the multi-aperture, and which is one of at least two detection units, is selected.

According to a further aspect, a charged particle beam for a plurality of charged particles and a method of operation thereof is provided. Thereby, a plurality of charged particle beams are emitted by an emitter array. The plurality of charged particle beams is focused on a specimen by a multi-beam charged particle optic, including a plurality of lens openings and an excitation coil common to the plurality of lens openings. The deflection of the individual charged particle beams and the detection of secondary and/or backscattered particles released on the impingement of the individual charged particle beams is conducted by similar means and/or with similar method steps as for any of the aspects described above.

Thus, if a number of "n" charged particle beams are provided, features concerning the detection and deflection of charged particles are provided n-times, whereby each one of the "n" detection means and each one of the "n" deflections means are associated with one of the "n" charged particle beams.

The invention is also directed to apparatus for carrying out the disclosed methods, including apparatus parts for performing each of the described method steps. These method steps may be performed by way of hardware components, a computer programmed by appropriate software, by any combination of the two or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein:

FIG. 1a shows a schematic side view of an embodiment of an electron beam device according to the invention;

FIG. 1b shows a further schematic side view of an embodiment of an electron beam device according to the invention, whereby an aperture unit is introduced;

FIG. 8 shows a further schematic side view of an embodiment of an electron beam device according to the invention, whereby the case of similar deflection angles is described;

FIGS. 9*a* and 9*b* show schematic top views of an embodiment of an electron beam device according to the invention, whereby the consequence of the similar deflection angles shown in FIG. 8 is further explained;

DETAILED DESCRIPTION OF THE DRAWINGS

Figure 2B:
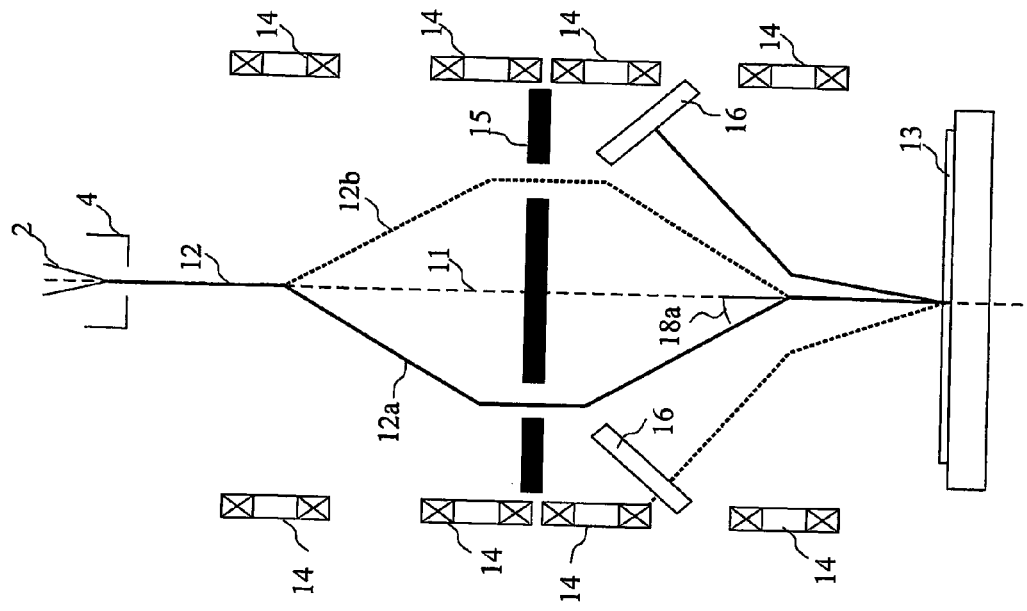
FIG. 2b shows a further schematic side view of an embodiment of an electron beam device according to the invention, whereby the deflection system is further modified.

Without limiting the scope of protection of the present application, in the following the charged particle beam device will exemplarily be referred to as an electron beam device. Thereby, the electron beam device might especially be an electron beam inspection system. The present invention can still be applied for apparatuses using other sources of charged particles and/or other secondary and/or backscattered charged particles to obtain a specimen image.

FIG. 1*a* shows a first embodiment according to the present invention. An emitting unit, which comprises an emitter 2 and an anode 4, emits electron beam 12. The electron beam is to be focused by an objective lens (not shown) on specimen 13, which is located on a specimen stage 6. Without deflection means 14, the beam would travel substantially along optical axis 11. The primary electron beam 12 causes secondary and backscattered particles to be released by specimen 13.

For ease of reference, in the embodiments described, it will solely be referred to secondary electrons without being limited thereto.

With deflection means, different beam paths 12*a* or 12*b* can be achieved. In the first case 12*a*, the first deflection stage 14 deflects electron beam 12 to the left away from the optical axis. The angle of deflection depends on the Lorenz-force, which is influenced by the strength of the magnetic field, the velocity of the electrons and the angle between the magnetic field and the velocity of the electrons. Generally, the deflection angle will be controlled by adjusting the magnetic field strength or by adjusting the potential accelerating the electrons. The magnetic field strength can be adjusted by the current applied to the excitation coil or by the number of windings used for the excitation coil.

In the context of the present application, the deflection angle is defined as the angle of charged particle beam propagation without the deflection and the charged particle beam propagation with deflection. Thereby, a positive or negative deflection angle refers to a deflection to the right or to the left, respectively.

The second deflection stage 14 redirects the electron beam towards the optical axis to the right. Thereby, the absolute value of the angle of deflection is twice the angle of the deflection of first deflection stage 14. Within this embodiment, this is achieved by doubling the current applied to the excitation coil of the deflector within the deflection stage. The third deflection stage 14 redirects the electron beam to follow the optical axis. Thereby, the absolute value of the deflection angle introduced by the third deflection stage is the same as the deflection angle of the first deflection stage.

As described above, the deflection angles used in this embodiment are similar for the first and third deflection stage and, for the second deflection stage, a multiple thereof. If this symmetry is further combined with an arrangement of the deflection stages with respect to each other such that the distance between the first and the second deflection stage is similar to the distance between the second and the third deflection stage, aberrations and dispersion can be minimized. The relation between the absolute values of the deflection angles can preferably be realized by connecting the deflection stages 14 in one electrical circuit. Thus, variations of the current applied concern the deflection stages equally. The different deflection directions can be realized by the direction of the windings or the direction of the current applied.

Backscattered electrons emitted by the specimen have a z-component of the velocity that is directed in the opposite direction to the z-component of the velocity of the primary electron beam. Thus, the Lorenz-force acting on the secondary electrons is directed in the opposite direction to the primary electrons. Consequently, the magnetic deflection fields applied to realize beam path 12*a* deflect secondary electrons to the right detection unit of the two detection units 16.

Alternatively, beam path 12*b* can be realized by e.g. applying a current of opposite direction to all deflection stages 14. Thereby, the first deflection stage 14 deflects primary electron beam to the right, the second deflection stage deflects the electron beam to the left, whereas the third deflection stage deflects the primary electron beam to the right back in the direction of optical axis 11. As a consequence, the secondary electrons are deflected to the left to impinge on the left detection unit 16. As can be seen, the deflection angle 18*a* for the primary electron beam and the deflection angle 18*b* for the secondary electrons differ such that a separation of primary and secondary electrons is realized. Separation in this context is not only understood as separating primary and secondary electrons of one possible beam path, but separating secondary electrons of all beam paths from all primary electron beam paths. Thus, a constructional arrangement can be realized that detection units 16 do not block either one of primary electron beam paths 12*a* or 12*b*.

As described with respect to FIG. 1*a*, two beam paths can be realized, each path resulting in the usage of its own detection unit. Thus, an operator can switch between the two detection units 14. Thereby, the second detection unit 16 can be used as a back-up for a damaged, contaminated or malfunctioning detection unit.

Generally, switching between detection units is to be understood as deflecting the charged particle beam such that secondary and/or backscattered particles do not impinge on detection unit x but, impinge on another detection unit y. Thereby, an operator can choose the detection unit whereon the charged particles impinge.

In case of a one-dimensional deflection as described above it is sufficient if a deflection stage comprises one deflector. A reference to deflectors in the following description is, unless otherwise stated, to be understood as a deflection stage which merely acts in one dimension. This could be achieved e.g. by using a deflection stage with only one deflector or by using a deflection stage with more than one deflector, whereby the deflection is realized merely within one plane. Accordingly, the reference signs used in the figures are used exchangeable for deflectors and deflection stages.

A further embodiment is shown in FIG. 1*b*. Therein, additionally to FIG. 1*a*, a multi-aperture 15 is introduced in the form of a plate. Multi-aperture 15 comprises two apertures 51. Multi-aperture 15 is located such that beam path 12a uses one aperture and beam path 12b uses the other aperture. As can be seen within FIG. 1b, multi-aperture 15 is located at substantially the same height as second deflector 14. Thus, the primary electron beam, which is, in contrast to the schematic drawing, deflected within an area having a finite length, can pass through the apertures 51 substantially orthogonal.

However, the location of multi-aperture 15 at the same height as second deflector 14 is optional and the scope of protection of the present application should not be limited thereto.

A further embodiment of the present invention will now be described with respect to FIG. 2a. Thereby, it is only referred to the differences with respect to FIGS. 1a and 1b. As described with respect to FIG. 1a, the second deflector 14 deflects the beam by a deflection angle with an absolute value twice as big as the absolute value of the deflection angles of the first and third deflectors. In FIG. 1a, this was achieved by doubling the current applied to the coil of magnetic deflector 14. In contrast thereto, FIG. 2a shows an embodiment wherein the doubled deflection angle is realized by doubling the number of coil windings of deflector 21 as compared to the coils of deflectors 14. In the schematic drawing this is indicated by the increased size of deflector 21 as compared to the sizes of deflectors 14.

As described with respect to FIGS. 1a and 2a, the deflection is conducted in a symmetrical manner. Thereby, aberrations can be minimized. However, if e.g. constructional aspects do not allow the symmetrical arrangement, embodiments (not shown) having different deflection angles for all three deflectors can also be realized.

Figure 2A:
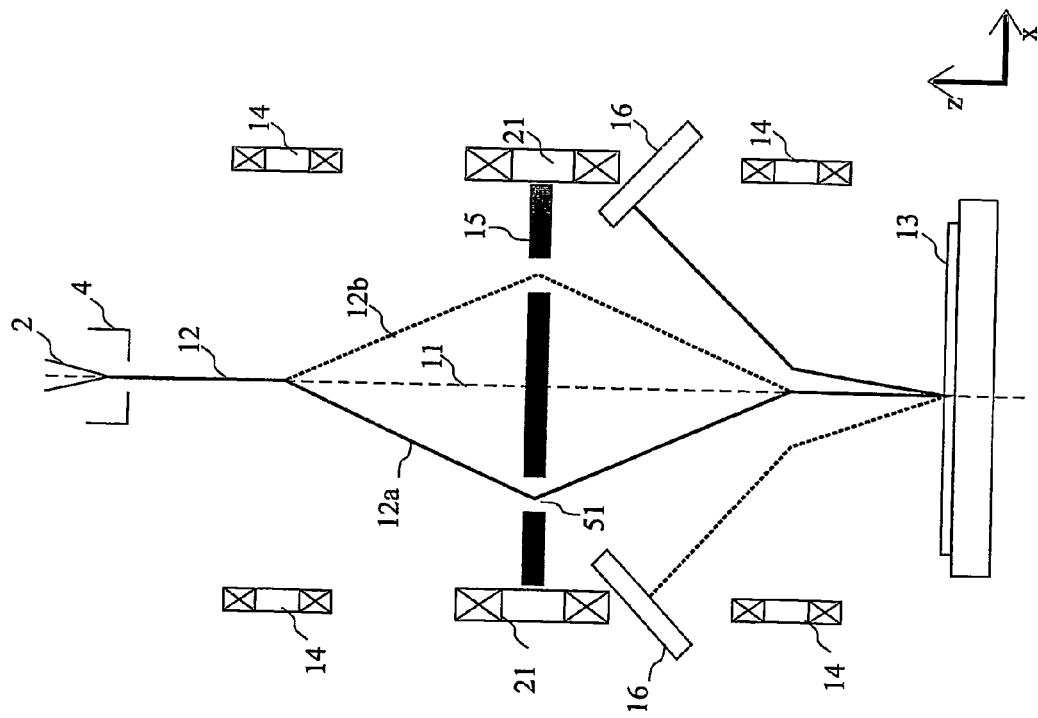
FIG. 2a shows a further schematic side view of an embodiment of an electron beam device according to the invention, whereby the deflection system is modified.

A further embodiment according to the present invention is schematically shown in FIG. 2b. In the following, the differences as compared to the embodiments in FIG. 1 will be described. In contrast to the 3-B-deflection system used in FIGS. 1a and 1b, FIG. 2b uses a 4-B-deflection system. Thereby, four magnetic deflectors are used. First deflector 14 deflects the beam away from the optical axis, whereas the second deflector 14 redirects the primary electron beam to travel substantially parallel to optical axis 11. As a result of the first two deflectors, the beam travels off-axis. After traveling through aperture 51, primary electron beam 12a or 12b, respectively, is deflected towards optical axis 11. The fourth deflector 14 redirects the primary electron beam to travel substantially along optical axis 11.

Due to the usage of four deflectors, the symmetry conditions to minimize aberrations are relieved. To minimize aberrations in the embodiment of FIG. 2b, solely the absolute values of the deflection angles of the first and second deflectors and the absolute values of the deflection angles of the third and fourth deflectors have to be equal. However, this advantage is in coincides with the disadvantage of increased space requirement and/or column length.

Figure 3:
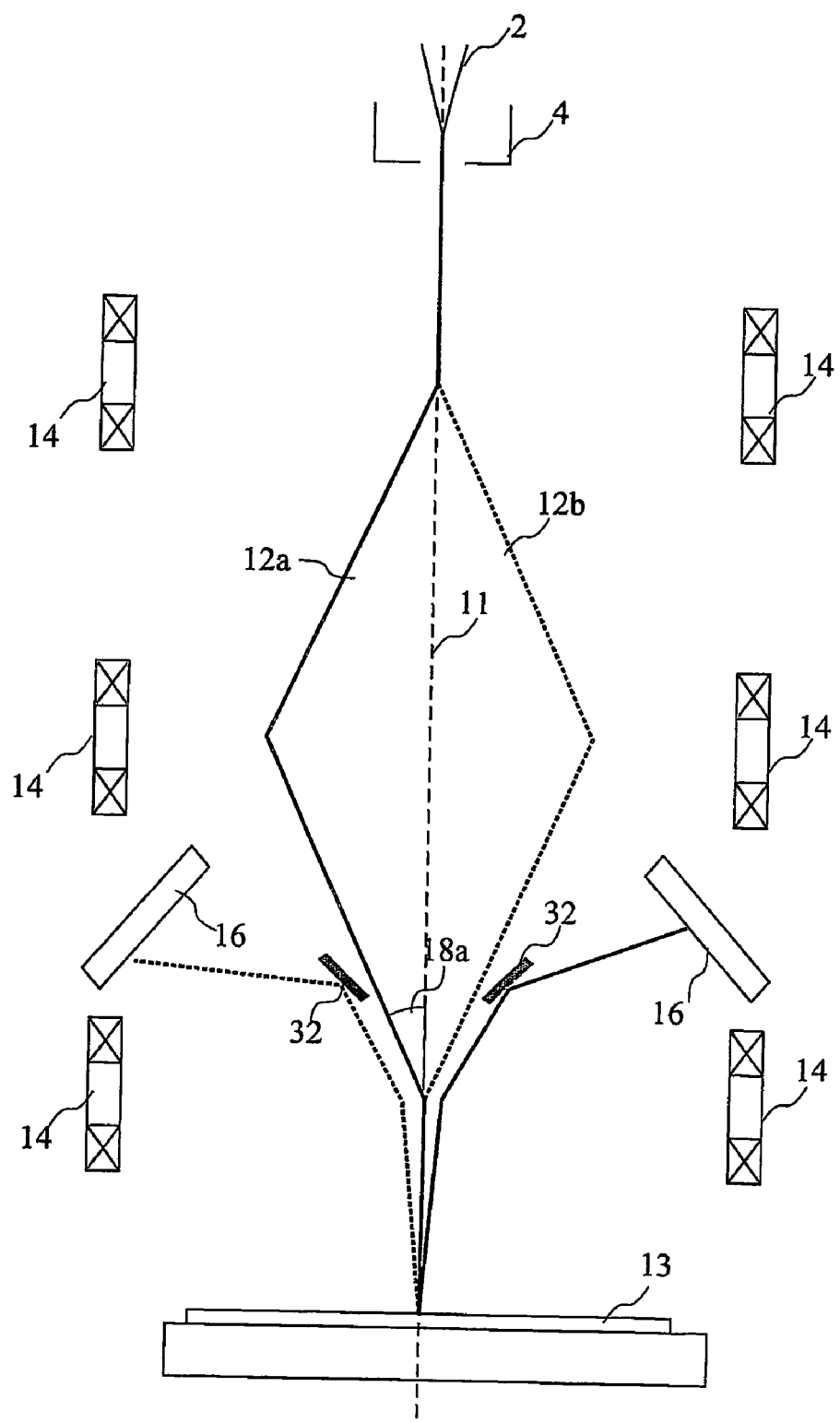
FIG. 3 shows a further schematic side view of an embodiment of an electron beam device according to the invention, whereby mirror units are introduced.

The embodiments shown previously have a sufficient beam separation of the primary electron beam and the secondary electrons of each possible beam path. Thus, detection units 16 could be positioned without disturbing any of the primary electron beam paths. However, this condition is generally not valid. In the embodiment shown in FIG. 3, the separation of the primary electron beam and the secondary electrons is comparably small. Therefore, detection units 16 could not be arranged in the path of the secondary electrons without disturbing any one of beam paths 12a or 12b. To increase the deflection of the secondary electrons, mirror units 32 are included. These mirror units can comprise charged electrodes to repel electrons and thus, to increase the deflection angle of the secondary electrons. Consequently, constructional limitations can be overcome.

Figure 4:
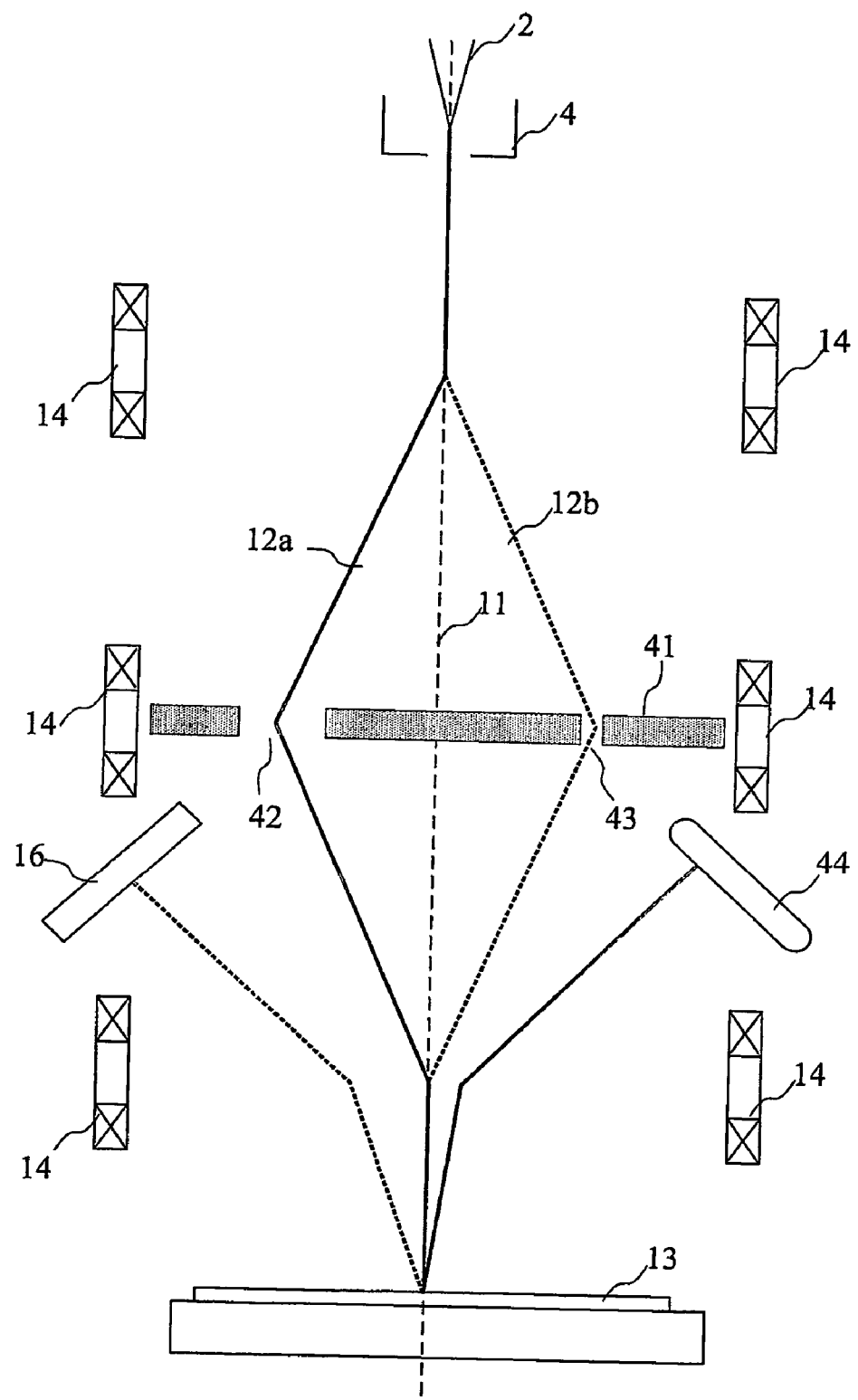
FIG. 4 shows a further schematic side view of an embodiment of an electron beam device according to the invention, whereby switching between operation modes is illustrated.

Within FIG. 4 a further embodiment is described. An emitting unit, which comprises an emitter 2 and an anode 4, emits electron beam 12, which is to be focused by an objective lens (not shown) on specimen 13. With deflection means, different beam paths 12a or 12b can be achieved. In the first case 12a, the first deflector 14 deflects electron beam 12 to the left away from the optical axis.

The second magnetic deflector 14 redirects the electron beam towards the optical axis to the right. Thereby, the absolute value of the angle of deflection is twice the angle of the deflection of first deflector 14. The third deflector 14 redirects the electron beam to follow the optical axis. Thereby, the absolute value of the deflection angle introduced by the third deflector is the same as the deflection angle of the first deflector.

As described above, the deflection angles used in this embodiment are similar for the first and third deflector and, for the second deflector, a multiple thereof. If this symmetry is further combined with an arrangement of the deflectors with respect to each other such that the distance between the first and the second deflector is similar to the distance between the second and the third deflector, aberrations can be minimized. The relation between the absolute values of the deflection angles can preferably be realized by connecting the deflectors 14 in one electrical circuit. Thus, variations of the current applied concern the deflectors equally. The different deflection directions can be realized by the direction of the windings or the direction of the current applied.

The increased deflection angle of the second deflector can be realized by any of the embodiments described with respect to FIG. 1 to 2a. Further, within the present embodiment, instead of the 3-B-deflection system shown, it would be possible to realize a 4-B-deflection system or to increase the deflection angle of secondary electrons with mirror units.

Backscattered electrons emitted by the specimen have a z-component of the velocity that is directed in the opposite direction to the z-component of the velocity of the primary electron beam. Thus, the Lorenz-force acting on the electrons is directed in the opposite direction for the secondary electrons as compared to the primary electrons. Consequently, the magnetic deflection fields applied to realize beam path 12a deflect secondary electrons to the right detection unit 44 of the two detection units.

Alternatively, beam path 12b can be realized by e.g. applying a current of opposite direction to all deflectors 14. Thereby, the first deflector 14 deflects the primary electron beam to the right, the second deflector deflects the electron beam to the left, whereas the third deflector deflects the primary electron beam to the right, back in the direction of the optical axis 11. As a consequence, the secondary electrons are deflected to the left to impinge on left detection unit 16.

As described with respect to FIG. 1a, two beam paths can be realized, each path resulting in the usage of its own detection unit. Compared to previous embodiments, the embodiment shown in FIG. 4 has two different types of detection units. As an example and not limiting to the present invention, detection unit 16 could be a scintillation detection unit and detection unit 44 could be a high current detection unit. Thus, by switching between the two beam paths 12a and 12b two operation modes of the charged particle system can be used.

Accordingly, multi-aperture 41 comprises two different apertures 42 and 43. Thus, for a high current operation mode, a large aperture 42 is used together with high current detection unit 44 and in the other mode a small aperture 43 is used in combination with the scintillation detection unit 16.

In contrast to switching to back-up components, within the embodiment of FIG. 4, a multi-mode operation is realized. Even though the embodiment of FIG. 4 referred to specific operation modes, it should be within the scope of the invention that any combination of operation modes, which are defined by the type of detection unit and the type of aperture, can be combined such that a switching between different beam paths 12a and 12b results in a switching of the modes. Thereby, a PIN-diode detector or a scintillation detector can be used with or without a spectrometer. The resulting permutations can be combined with similar apertures or with different apertures, respectively. According to a further alternative of variation of the measurement modes, similar detectors can be combined with different apertures. Thus, different resolutions and different currents can be combined with each other.

Thus, the present invention is either directed to switching between similar detectors and/or between different detectors. Thereby, the term similar is to be understood such that the switching is conducted from one detector to another detector, whereby the two detectors are substantially equal. That is, the two detectors have substantially the same sensitivity, size, response time and other characteristics. Thus, the two similar detectors are used for a back-up. The term different is to be understood such that the two detectors have substantially different sensitivity, size, response time or any other characteristics. Thus, the two different sensors are used to gain different information from measurements with the two sensors. An according usage of the term similar and different is also used for the aperture associated with the detectors.

Figure 5A:
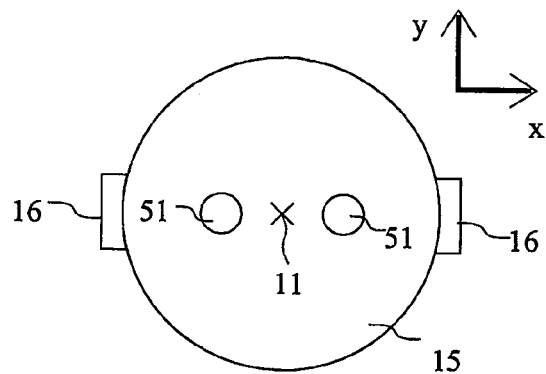
FIGS. 5a to 5d show top views of embodiments of aspects of the invention, whereby different detection unit/aperture arrangements are illustrated.

The different aspects of the embodiments described above will now be extended while referring to the top views shown in FIGS. 5a, 5b, 5c, 5d as well as 6a and 6b. Additionally, a further embodiment will be described with respect to FIG. 6c. In FIG. 5a a top view from above multi-aperture 15 is shown. There are two apertures 51 located symmetrically with respect to the optical axis. Further, the detection units 16 are located on the same axis as apertures 51. As indicated by multi-aperture 15 overlapping detection units 16, aperture unit 15 is located above detection units 16. The arrangement of apertures 51 and detection units 16 along one line allows to switch between one aperture and its corresponding detection unit to the other aperture and its corresponding detection unit with a one-dimensional deflection. However, this also leads to limitations, which will be described with respect to FIGS. 8 to 12.

A short preview of this limitation, and the solution thereof, will now be given. Within the embodiments described above, a beam separation due to sufficiently large differences in the deflection angles 18a and 18b between primary and secondary electrons was given (see FIG. 1a). In the case of small beam separation, a mirror unit was applied. However, there are applications with practically no beam separation of primary electrons of one path with secondary electrons of all other beam paths. Thus, a detection unit for detecting the secondary electrons of one beam path, e.g. 12a (see FIG. 1a) would block the primary electron beam of the other beam path 12b. Further, there are applications wherein the beam separation is not sufficient for introducing a mirror unit 32. This limitation can be overcome by introducing a deflection in a second dimension. Thus, primary beams can travel through the electron beam column on e.g. the left side on several beam paths, whereas several detection units are e.g. located on the right side. More details of this aspect will be described with respect to FIGS. 8 to 12.

Figure 5B:
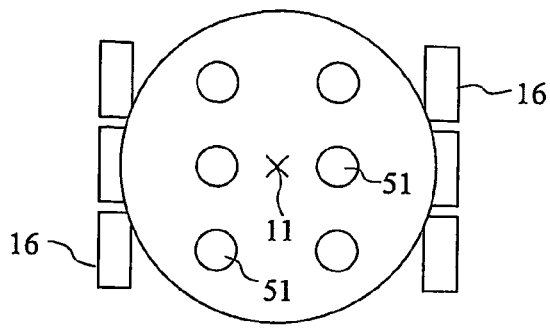
Figure 5C:
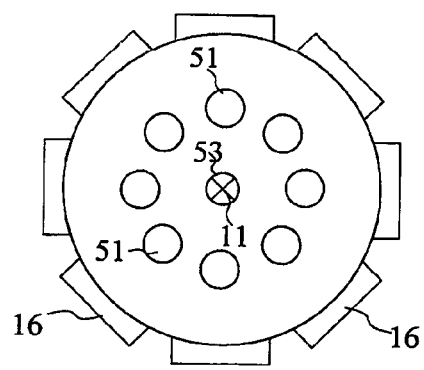
Figure 5D:
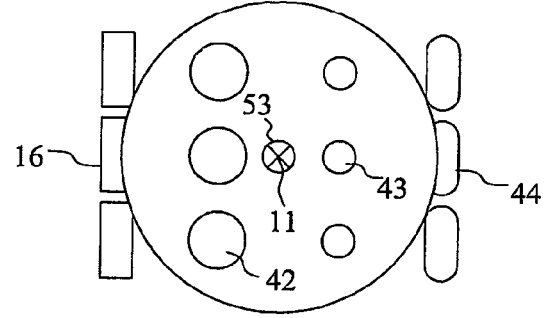

Introducing a deflection in a second dimension can further be used to increase the number of apertures 51 and detection units 16 arranged in the electron beam column. Respective embodiments are shown in FIGS. 5b to 5d. For the sake of clarity of the schematic drawings, only a limited number of components is denoted with the respective reference numbers.

FIG. 5b shows an embodiment, wherein six apertures 51 and six detection units 16 are used. Thereby, the primary electron beam and the secondary electrons have to be deflected to six different beam paths. This is done by a two-dimensional deflection. Thus, in the embodiment shown, the maintenance frequency for apertures 51 and detection units 16 can be increased by a factor of six.

The embodiment of FIG. 5c has a maintenance frequency that is increased by a factor of eight. Apertures 51 and detection units 16 are arranged in octupole symmetry around optical axis 11. Thereby, the deflection can either be realized by a coordinated 2-dimensional deflection system or by an octupole deflection system. Additionally to apertures 51, a central aperture 53 is provided. Thus, an inspection of a specimen or the like can also be conducted without a beam deflection.

FIG. 5d also has a central aperture 53 for a non-deflection measurement mode. In contrast to the embodiment of FIG. 5b, two different types of detection units 16 and 44 and two different types of apertures 42 and 43 are provided. Thus, the aspect of back-up components and the aspect of switching between measurement modes can be combined.

Figure 6A:
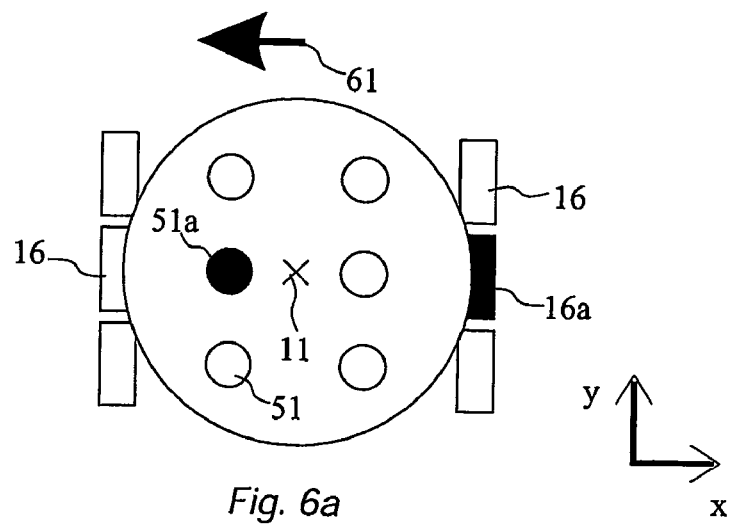
FIGS. 6a to 6c show further top views of embodiments of aspects of the invention, whereby the correspondence between detection units and apertures is described.

With respect to FIGS. 6a to 6c, the correspondence between apertures 51 and detection units 16 will be described. FIG. 6a shows a case, wherein a Lorenz-force indicated by arrow 61, which is induced by a magnetic field, acts on the primary electron beam in the deflection area of the first and the last deflector (not shown, see FIG. 1). Thus, the primary electron beam is deflected to travel through the aperture 51a, which is marked black. Since the Lorenz-force on the secondary electrons with substantially the opposite direction acts in the opposite direction, detection unit 16a corresponds to aperture 51a.

Figure 6B:
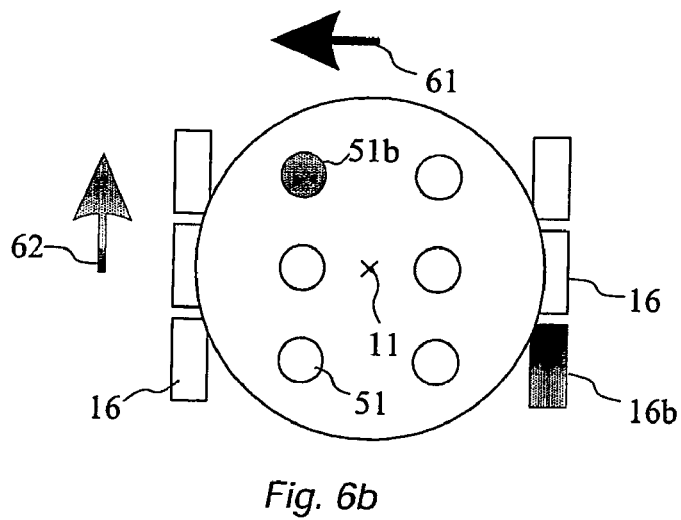
Figure 6C:
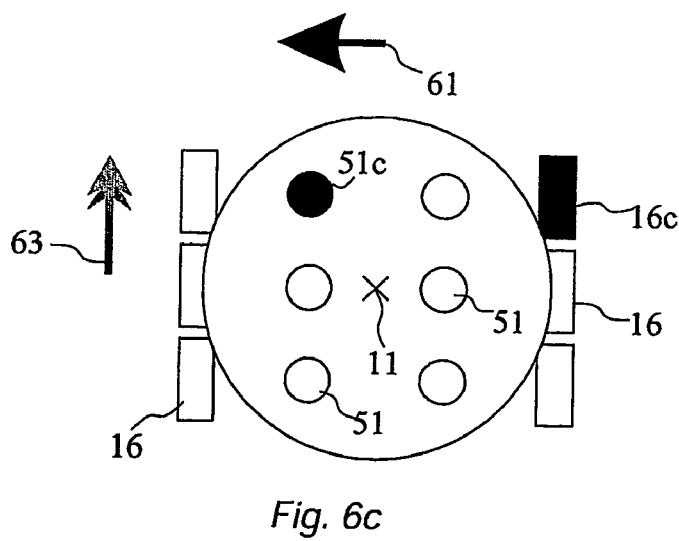

In FIG. 6b a second Lorenz-force 62, which is substantially orthogonal to first Lorenz-force 61, acts on the electrons within the area of the first and the last deflection stage. Thus, the primary electron beam travels through aperture 51b. According to the arguments presented above, the secondary electrons are deflected towards detection unit 16b. Thus, aperture 51b corresponds to detection unit 16b.

FIGS. 6a and 6b only referred to magnetic deflections in both dimensions. However, especially in one of the two dimensions, it is also possible to use electrostatic deflectors in deflections stages. A respective embodiment is described in FIG. 6c. Thereby, arrow 63 indicates the force of an electrostatic field. The different shape of arrow 63 symbolizes the difference between the magnetic and the electrostatic force acting on the electrons. As described above, a Lorenz-force in x-dimension realizes a correspondence between the left row of apertures and the right row of detection units and vice versa. A Lorenz-force in y-dimension realizes a correspondence between the upper row of apertures and the lower row of detection units and vice versa. In contrast to FIG. 6b, the electrostatic force 63 in y-dimension acts in the same direction for primary electrons and secondary electrons. Thus, the electrostatic force of the last deflector acts in the same direction for the primary and the secondary electrons, irrespective of the direction of the velocity of the electrons. Consequently, detection unit 16c corresponds to aperture 51c. This might be better understood while referring to FIG. 7.

Figure 7:
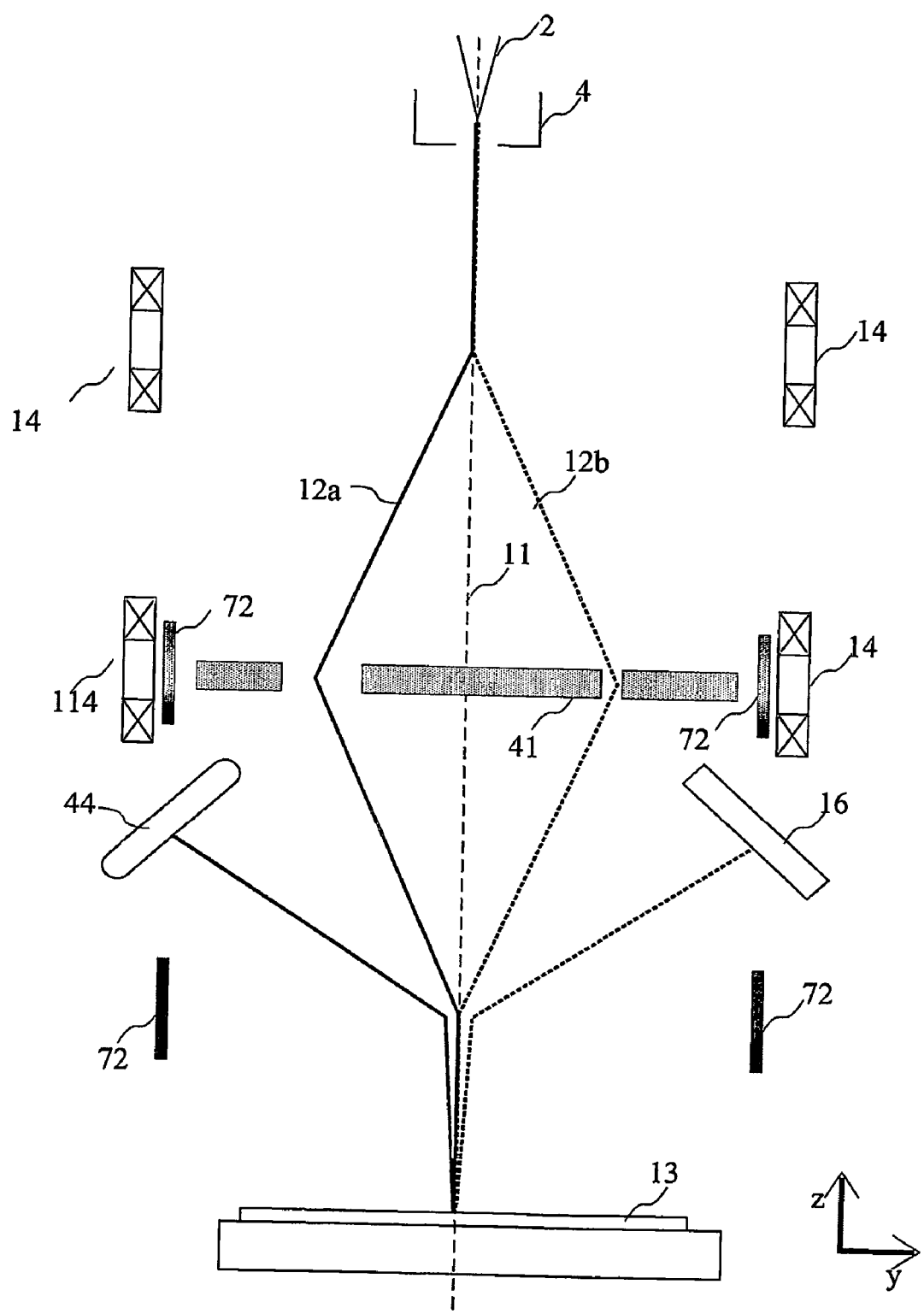
FIG. 7 shows a further schematic side view of an embodiment of an electron beam device according to the invention, whereby the use of electrostatic deflectors is illustrated.

In FIG. 7, an electron beam column with a deflection in a second dimension y is shown. An emitting unit, which comprises emitter 2 and anode 4, emits electron beam 12. Referring to the first beam path 12a, first deflection stage 14 deflects electron beam 12 to the left to travel through large aperture 42. Due to the size of aperture 42, high beam currents are available. The second deflection stage comprises a magnetic deflector 14 and an electrostatic deflector 72. Thereby, to minimize aberrations, symmetry aspects of the deflection are considered. That is, the magnetic deflector realized a deflection angle that is equal to the deflection angle realized by first magnetic deflector 14. Thus, without electrostatic deflector 72, electron beam 12 would substantially travel parallel to optical axis 11. With the electrostatic deflector 72, the electron beam travels towards optical axis 11. The second electrostatic deflector 72 redirects electron beam 12 such that it travels along optical axis 11. Thereby, the deflection angles realized merely by the two electrostatic deflectors are equal. Thus, aberrations can be minimized. On the impingement of primary electron beam 12 on specimen 13, secondary electrons are released.

The secondary electrons traveling through the deflection field of second electrostatic deflector 72 are deflected to the left, since the electrostatic force is independent of the direction of the velocity of the electrons. Thus, beam path 12a is deflected to high current detection unit 44 on the left side. A deflection of the electrons along beam path 12b is realized accordingly.

The symmetry of the deflection fields applied is not compulsory for the embodiments described with respect to the previous figures. However, to minimize aberrations, a beam deflected in one direction with a defined field should be re-deflected by a similar field with the opposite direction. Generally, however, it is possible to combine e.g. a magnetic deflection and an electrostatic redirection, and to combine deflections and redirections of different angles. Further, it should be noted that the difference between magnetic and electrostatic deflection, described with respect to FIGS. 6b, 6c and 7, are valid in the case where merely the last deflector is magnetic or electrostatic, respectively.

Thus, in the context of this application, if it is referred to the difference between magnetic and electrostatic deflection systems, only the deflector closest to the specimen has to be magnetic or electrostatic, respectively. As already explained, it is however a best mode option to use symmetric deflection systems.

The embodiments described with respect to FIGS. 1 to 7 referred to the case which had a sufficient beam separation between secondary electrons of any of the possible beam paths and primary electrons of any of the possible beam paths. As can be seen from FIG. 8, this condition is not necessarily valid. FIG. 8 shows an embodiment with a retarding electrode 82. This electrode decelerates primary electrons to impinge with lower energy on specimen 13. In the embodiment of FIG. 8, retarding electrode 82 and specimen 13, which is located on specimen stage 6, are biased by respective controllers 83 and 84.

However, retarding electrode 82, besides decelerating primary electrons, also accelerates secondary electrons. Thus, above retarding electrode 82, primary and secondary electrons have substantially the same velocity. Consequently, within the deflection field of magnetic deflector 14, substantially equal deflection angles 88 are realized. The horizontal distance between primary and secondary electrons is only used for the sake of clarity of the figure. As a result, secondary electrons following the beam path indicated overlay with an alternative beam path for the primary electron beam in one dimension. This can be better understood while referring to FIG. 9a.

Within the top view provided in FIG. 9a, primary electron beams are indicated with circles, whereas secondary electron paths are indicated with squares. For a one-dimensional deflection system and equal deflection angles 88 (see FIG. 8), the condition indicated with symbols 91 and 92 is obtained. A primary beam 91 on the left side would result in a secondary electron beam path 92 on the right side, whereas an alternative beam path (see 12b in FIG. 1a) has a primary beam 92 on the right side and a secondary beam path 91 on the left side. As indicated by the symbol, which is a mixture of a circle and a square, a detection unit for detecting secondary electrons of either one of the secondary beam paths would block the primary beam of the alternative beam path. Thus, having equal deflection angles 88 (see FIG. 8), a one dimensional deflection system cannot be used.

However, if deflection in two dimensions is used, the following scenario described with respect to FIG. 9a can be realized. Thereby, a first primary electron beam can be deflected to the top-left quadrant. The corresponding secondary electrons are deflected by a two-dimensional magnetic deflection system to the lower right quadrant. Thus, a detection unit can be located at the position of secondary electron beam path 94a. An alternative beam path can be realized as follows. The primary electron beam can be deflected to the lower-left quadrant. The secondary electrons corresponding to this primary electron beam 93b can be detected at position 94b. Thus, for a two-dimensional deflection, alternative beam paths corresponding to at least two different detection units can be realized.

Within FIG. 8, this is indicated by arrows 85 and 86. The primary electron beam can be moved in an area 96, as shown in the top view in FIG. 9b. Consequently, the beam paths of secondary electrons move such that it can be detected with detection systems positioned within area 95. As shown in FIG. 9b, the area 96 for the primary electron beams is smaller than the area for the secondary electron beam paths. Generally, a detection unit has a finite size. To overcome the resulting constructive limitations, the space assigned for the primary electron beam can be reduced. This is also indicated in FIG. 9a. Therein, the space to be used for detection systems is indicated by area 99. In FIG. 9a, the space for detection arrangements can be enlarged into the left part of the electron beam column without disturbing the primary electron beams 93a and 93b. Generalizing this idea to FIGS. 8 and 9b leads to the area 96 for the primary electron beam and the area 95 for detection systems for the secondary electrons.

Figure 10A:
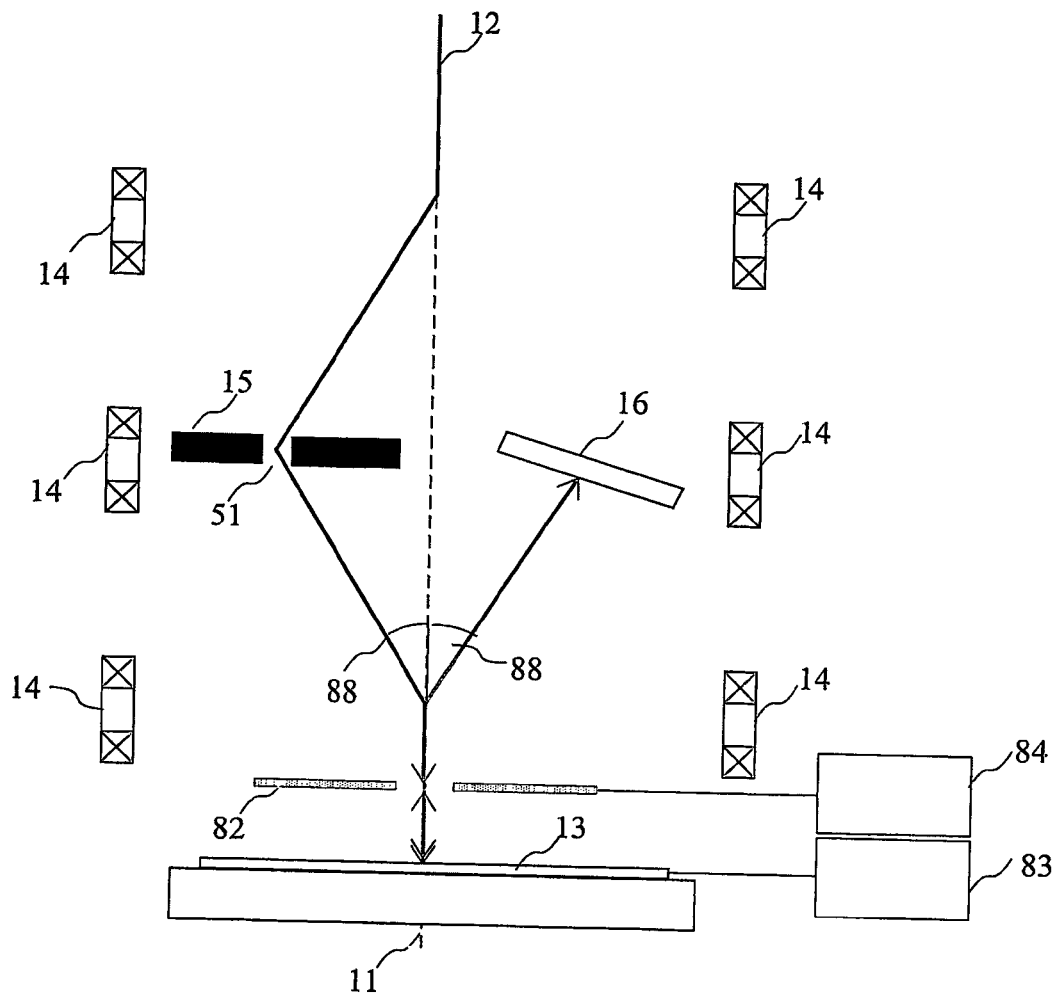
FIGS. 10*a* and 10*b* show schematic views of an embodiment of an electron beam device according to the invention.
Figure 10B:
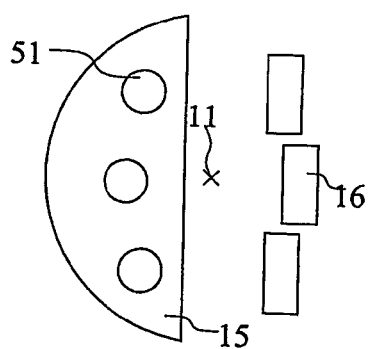

A further embodiment is now described with respect to FIGS. 10a and 10b. Primary electron beam 12 is deflected in a manner described with respect to FIG. 1a using the 3-B-deflection system comprising deflectors 14. Thereby, primary electron beam 12 travels through aperture 51 of aperture unit 15. A retarding electrode, which is set on a defined potential via controller 84, decelerates the primary electrons. The retarding electrode accelerates secondary electrons released by specimen 13 on impingement of primary electron beam 12. Thus, for secondary electrons, electrode 82 can be considered an extraction electrode. Electrode 82 accelerates secondary electrons at substantially the same absolute velocity as primary electrons within the column.

Due to the magnetic deflection field of lowest deflection stage 14, secondary electrons are deflected to the right to impinge on the surface of detection unit 16. Since the absolute values of the velocity of primary and secondary electrons are substantially the same, the absolute values of the deflection angles 88 are substantially the same. More details can be seen from the top view shown in FIG. 10b.

Multi-aperture 15 is provided in the form of a disc sector in order to have sufficient space for detection systems 16. As already mentioned with respect to previous figures, for the sake of clearness, only some components of identical components are denoted with reference signs. Within multi-aperture 15, three apertures 51 are provided. Due to the two-dimensional deflection it is possible to have three apertures and three detection units for redundancy purposes. Thereby, primary electron beams and secondary electron paths are deflected into different sectors of the electron beam column. Thus, constructional limitations can be overcome.

According to an alternative solution, the detectors 16 shown in FIG. 10b can be replaced by one extended scintillation detector. Thereby, in the case when one area of the detector is malfunctioning because of contamination or the like, a different area of the same scintillator can be used. Thus, the switching is not conducted between separated detectors, but between different areas of the same detector. Thus, in certain applications, redundancy could also be implemented with one sufficiently large area.

Figure 11:
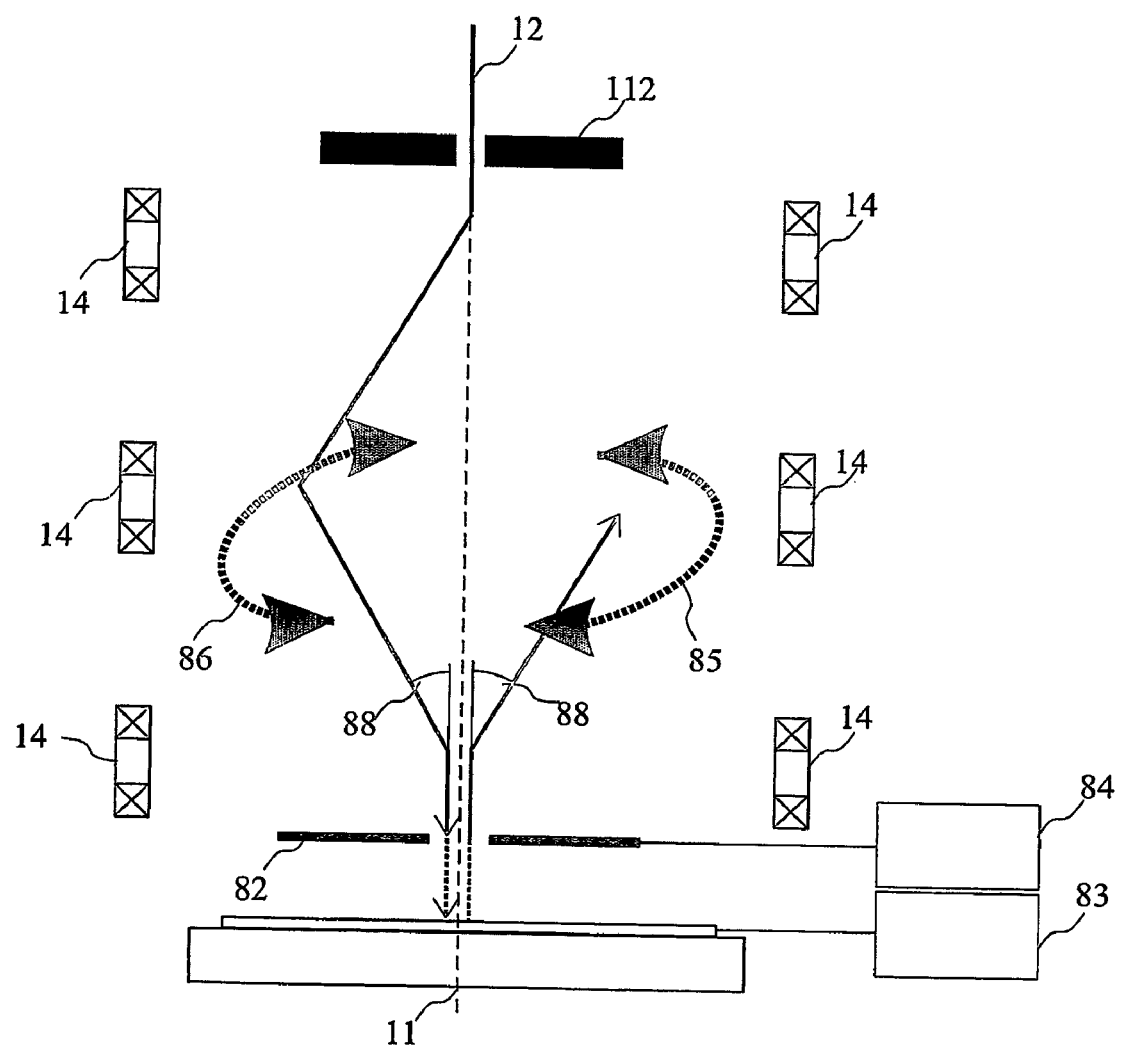
FIG. 11 shows a schematic side view of an embodiment of an electron beam device according to the invention, whereby a different aperture unit is illustrated.

A further embodiment is shown in FIG. 11. As indicated with arrows 86 and 85, primary electron beams and secondary electron paths used different areas, thus not getting into each other's way. In contrast to the embodiment of FIG. 10, an aperture unit 112 is provided above the three-stage deflection system comprising magnetic deflectors 14. Aperture unit 112 has one beam-shaping aperture. Thus, a redundancy can only be provided with respect to detection units (not shown).

Figure 12A:
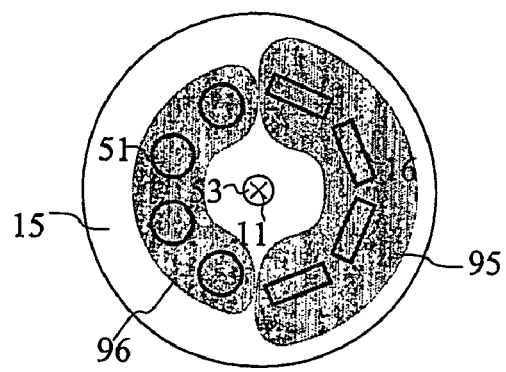
FIGS. 12*a* to 12*c* show schematic top views of embodiments of an electron beam device according to the invention, whereby different detection unit/aperture arrangements are described.
Figure 12B:
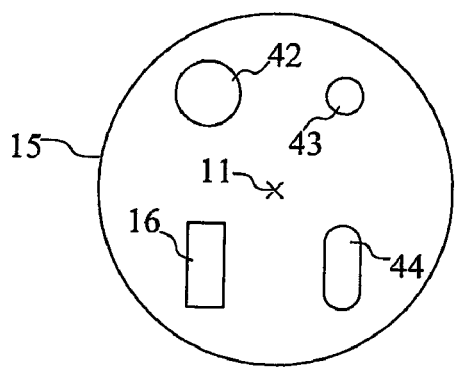
Figure 12C:
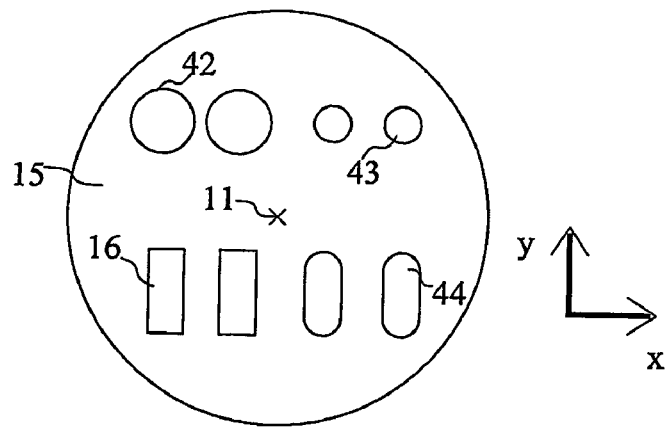

Further embodiments are shown in FIGS. 12a to 12c. Therein, different arrangements of apertures 42, 43 51, 53, respectively, and detection units 16 or 44, respectively, are shown. Within FIG. 12a, an embodiment with four apertures 51 and one central aperture 53 is shown. The central aperture is located to be concentric with optical axis 11. The four detection units 16 are located below multi-aperture 15. Multi-aperture 15 is provided in the form of a circular disc. Compared to the disc sector shown in FIG. 10b, the disc 15 of the present embodiment can be attached to the system more easily.

Detection units 16 and apertures 51 are arranged within separate areas 95 and 96, respectively. These areas are marked gray. Thus, even though the absolute values of deflection angles 88 (see e.g. FIG. 11) are equal, detection units do not block any of the primary charged particle beams.

According to the further embodiment of FIG. 12b, within multi-aperture unit 15 a large aperture 42 and a small aperture 43 are provided. The large aperture corresponds to detection unit 44, whereas the small aperture 43 corresponds to detection unit 16. As explained with respect to several embodiments before, this correlation is realized by a two-dimensional magnetic deflection system. Comparable to the embodiment of FIG. 12a, apertures and detection units are separated in different areas. Within the embodiment of FIG. 12b, apertures are provided in the upper half of multi-aperture disc 15. Consequently, secondary electrons are deflected towards the lower half of disc 15. Again, a separation of all primary electron beams with respect to all secondary beam paths can be achieved. Thus, it is possible to use beam deflection systems to switch between two different operation or measurement modes. Large aperture 42 and high current detection unit 44 realize one mode of the present embodiment. Small aperture 43 and scintillation detection unit 16 realize a further mode. However, these modes are referred to for illustrating purposes only. As described with respect to FIG. 4, the mode switching can also be realized for other modes.

According to the further embodiment shown in FIG. 12c, the aspect of operation mode switching and the aspect of switching between back-up components are realized. FIG. 12c shows an embodiment with two large apertures 42, two small apertures 43, two detection units 44 and two detection units 16. Each detection unit has a corresponding aperture. The primary electrons are deflected to travel through one of the apertures making use of a deflection in x-dimension and y-dimension. The secondary electrons released by a specimen are deflected to the corresponding detection unit. The deflection can be realized using 3-B-deflection systems, 4-B deflections systems or the like.

The embodiments described with respect to FIGS. 1 to 12, refer to three-stage deflection systems, four-stage deflection systems, one-dimensional or two-dimensional deflection; in the case of three dimensional deflection systems increased currents or an increased number of windings for the center deflector 14 are described; further, switching between at least two detection units and additional switching between at least two apertures is described; thereby, the switching is described as either providing back-up components or as providing components for different operation modes; beyond this, embodiments with different deflection angles for primary and secondary electrons, with mirror units or with similar deflection angles for primary and secondary electrons are illustrated; also the difference between magnetic deflection systems and electrostatic deflection systems, that is, the deflector closest to a specimen being magnetic or electrostatic, has been described. It is apparent that e.g. a three-stage deflection system and a four-stage deflection system cannot be combined. However, other combinations can be realized, which are not illustrated by separate embodiments.

To give some examples without being limited thereto: the usage of a multi-aperture can be combined with all aspects of deflection system. Further, the realization of the 3-B-deflection system is independent of a one-dimensional (in one plane) or two-dimensional deflection or the aspect of switching between modes or switching between back-up components. Additionally, different methods of deflection can be independently applied for each dimension of deflection.

The above embodiments solely referred to the deflection of one electron beam. However, the aspects described exemplarily with respect to one electron beam can also be realized for a multi-beam charged particle device. An exemplary embodiment is now described with reference to FIG. 13.

Device 130 has a housing 131 and a specimen chamber 135. The housing as well as the specimen chamber can be evacuated through vacuum ports. Within the specimen chamber, specimen 13 is located on specimen stage 136, which can move the specimen independently in two directions. For control of the specimen, movement control unit 136' is connected to specimen stage 136. Each of the four electron beams 12 has its own optical axis 11. The beams are emitted by an emitter array 132. The emitter array is controlled by control unit 132', that is, the beam current, the anode potential and a possible synchronization of the electron beams with the scanning over specimen 13 for each electron beam, respectively, is controlled. A multi-lens system 133 comprising an einzel-lens module for each electron beam is used as a condenser lens for the four charged particle beams. The lens system 133 is controlled by control unit 133'. For focusing the electron beams on specimen 13, a magnetic electrostatic compound lens 134 for all electron beams is used. Thereby, magnetic sub-lenses share a common excitation coil and for each electron beam an electrostatic sub-lens is integrated in the compound lens. The components of the magnetic electrostatic compound lens are controlled by control unit 134'.

Figure 13:
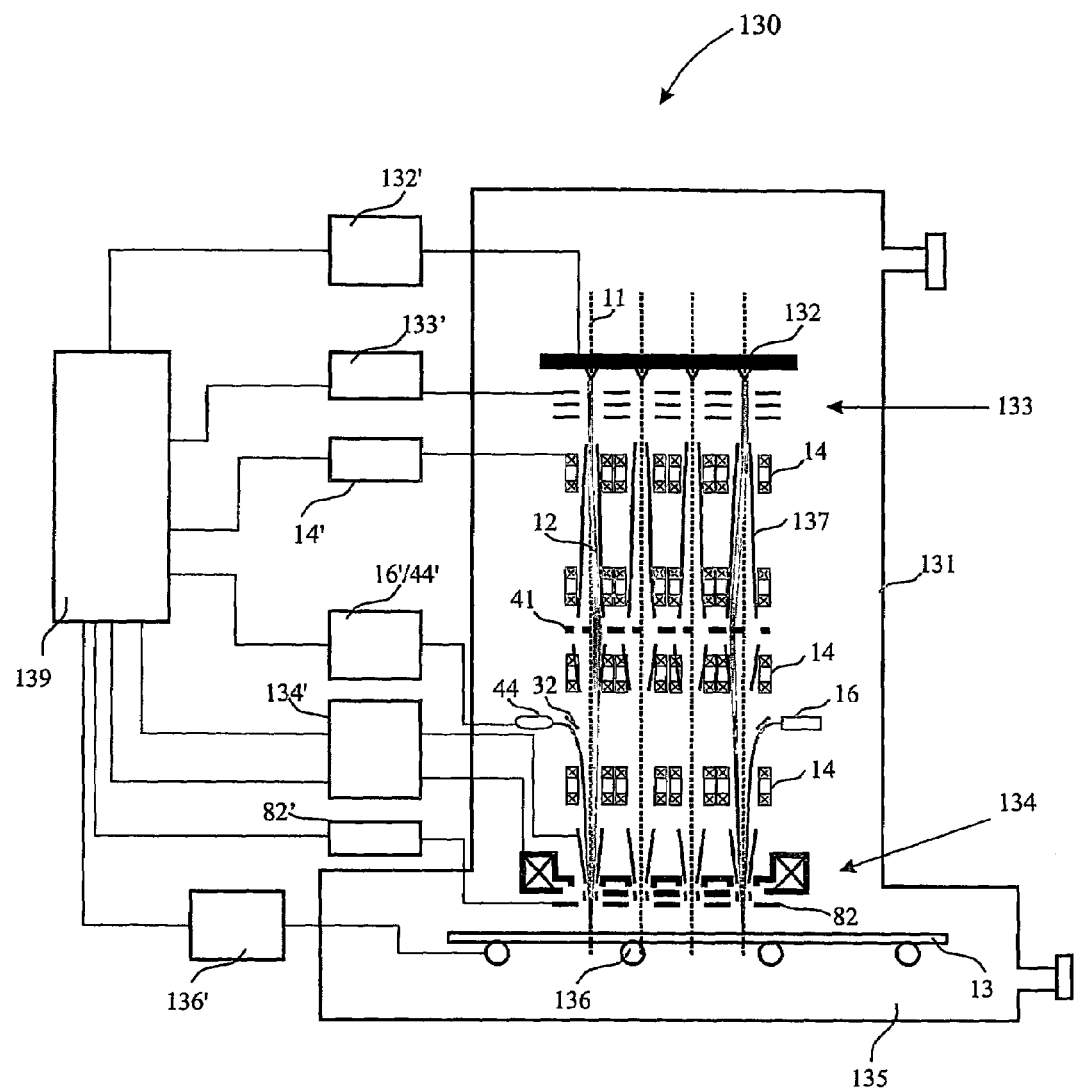
FIG. 13 shows a schematic side view of an embodiment of an electron beam device according to the invention, whereby an electron beam device for a plurality of beams is illustrated.

Within FIG. 13, the einzel lens 133 and the magnetic electrostatic compound lens 134 are used exemplarily. Instead, two einzel-lenses could be used, namely as a condenser lens and as an objective lens. Alternatively, two magnetic electrostatic compound lenses could be used, namely as a condenser lens and as an objective lens. However, it is also possible that no condenser lens is required and only one multi-beam lens is used. Thereby, an einzel lens or a magnetic electrostatic compound lens could be used. Generally, within all of the variations described above instead of the magnetic electrostatic compound lenses also magnetic lenses could be used.

Further, an extraction electrode 82 and a respective control unit 82' are provided, whereby an extraction field corresponding to each of the four electron beams is realized. Additionally, for each electron beam 12, electrodes 137 for providing a beam boost potential are provided.

Beyond the above-mentioned components, a deflection-switch system is provided for each electron beam. The systems comprise a SB-deflection system with four magnetic deflection stages. First deflection stages 14 deflect electron beams 12 to the left or to the right, depending on the kind of aperture used within aperture unit 41. For each electron beam, aperture unit 41 comprises a large aperture for a high current measurement mode and a small aperture for a high resolution measurement mode.

Secondary electrons are separated from the primary electron beams by mirror units 32, which are provided for each deflection direction for each electron beam. The beam separation of the schematic drawing of FIG. 13 is illustrated within the plane of the figure. This is done for the sake of easier drawing only. Generally, the beam separation and thus, the arrangement of the detection units can also be realized in a dimension orthogonal to the plane of the figure.

On the one hand, for the high current measurement mode, detection unit 44 is provided for each electron beam. Within FIG. 13, only one of these detection units is shown. On the other hand, for the high resolution measurement mode scintillation detection units are provided for each electron beam. Again, only one detection unit is shown in FIG. 13. If the beam deflections are realized in a dimension orthogonal to the plane of the schematic drawing, detection units 44 and 16, respectively, can be realized for each electron beam without constructive limitations.

All detection units are controlled by controller 16'44', whereas each deflection stage 14 is controlled by control unit 14'. Thereby, all deflection stages for one electron beam share a common electrical circuit. Thus, variations of the current are applied to all coils simultaneously. However, the deflection systems for the individual beams are controlled separately. Therefore, different electron beams can be operated at different modes independently of each other. The control units described are connected to a general controller 199 in the form of a work station, a personal computer or any other system applicable for provided a graphical user interface for an operator and a synchronization and control of the individual components.

Generally, the inventive aspects described with reference to exemplary embodiments can be used to switch between several back-up components and/or to switch between several measurement modes. Thereby, an operator can switch also between different components, especially apertures and detection units. Due to the two-dimensional deflection, constructive limitations, which can be given depending on the deflection angles of primary and secondary electrons, can be overcome.

The invention claimed is:

1. A charged particle beam device, comprising:
    a charged particle emitter for emitting a primary charged particle beam;
    a deflection system, comprising three deflection stages, wherein the deflection system is arranged for deflecting the primary charged particle beam and specimen-released charged particles along a first or a second beam path; and
    at least two detection units, each associated with one of the first or second beam path, so that the deflection system is adapted to switch between the at least the two detection units, wherein one of the three deflection stages is closer to a specimen stage than the two detection units.

2. The charged particle beam device according to claim 1, further comprising:
    an aperture unit for shaping the charged particle beam.

3. The charged particle beam device according to claim 2, wherein the aperture unit is a multi-aperture unit having at least two apertures; and wherein each aperture of the two apertures is associated with one of the first or second beam path so that the deflection system is adapted to switch between the two apertures and a corresponding detection unit of the two detection units.

4. The charged particle beam device according to claim 3, wherein the apertures are arranged in a first sector area and the detection units are arranged in a second sector area, and wherein the first and the second sector areas do not overlap.

5. The charged particle beam device according to claim 1, wherein the deflection system comprises six dipole deflectors and is arranged for deflecting the primary charged particle beam and the specimen-released charged particles in two dimensions.

6. The charged particle beam device according to claim 5, wherein each of the three deflection stages comprises two of the six dipole deflectors.

7. The charged particle beam device according to claim 1, wherein each of the three deflection stages comprises a magnetic deflection component.

8. The charged particle beam device according to claim 1 claims, wherein a primary beam deflection angle and a specimen-released charged particles deflection angle are different.

9. The charged particle beam device according to claim 1 further comprising a mirror unit.

10. The charged particle beam device according to claim 1, wherein a primary beam deflection angle and a specimen-released charged particles deflection angle are substantially the same.

11. The charged particle beam device according to claim 1, wherein the three deflection stages are arranged symmetrically to a plane substantially orthogonal to the optical axis.

12. A method of imaging a specimen, comprising:
    providing a primary charged particle beam;
    deflecting the primary charged particle beam away from an optical axis using a first deflection stage of a deflection system;
    deflecting the primary charged particle beam towards the optical axis using a second deflection stage of a deflection system;
    redirecting the primary charged particle beam to travel substantially along the optical axis using a third deflection stage;
    focusing the primary charged particle beam on a specimen such that the specimen releases charged particles; and deflecting the specimen-released charged particles, whereby the third deflection stage is controlled such that one detection unit of two detection units is selected.

13. The method of imaging a specimen according to claim 12, wherein the first and the second deflection stages are controlled such that an aperture of a multi-aperture unit is selected, wherein the aperture corresponds to a detection unit of the two detection units.

14. The method of imaging a specimen according to claim 12, wherein the deflecting of the primary charged particle beam and the specimen-released charged particles are conducted in two dimensions.

15. A multiple charged particle device, comprising:
a charged particle emitting unit for emitting a plurality of primary charged particle beams;
a plurality of deflection systems, each comprising at least three deflection stages, wherein the deflection system is arranged for deflecting the plurality of primary charged particle beams and a plurality of specimen-released charged particles along a plurality of at least a first or a second beam paths;
a plurality of at least two detection units, each of the plurality of the at least two detection units associated with one of the plurality of primary beams and each of the at least two detection units associated with one of the at least first or second beam path so that the deflection systems are adapted to switch between the at least two detection units; and
a multi-lens unit for focusing the plurality of charged particle beams.

16. A charged particle beam device, comprising:
a charged particle emitter for emitting a primary charged particle beam;
a deflection system, comprising three deflection stages, wherein the deflection system is arranged for deflecting the primary charged particle beam and specimen-released charged particles along a first or a second beam path;
two detection units each associated with one of the first or second beam path so that the deflection system is adapted to switch between the two detection units;
wherein one of the three deflection stages is closer to a specimen stage than the two detection units;
wherein the charged particle beam device further comprises an aperture unit for shaping the charged particle beam, wherein the aperture unit is a multi-aperture unit comprising two apertures; and
wherein each aperture of the two apertures is associated with one of the first or second beam path so that the deflection system is adapted to switch between the two apertures and the corresponding detection unit of the two detection units.

* * * * *

UNITED STATES PATENT AND TRADEMARK OFFICE
CERTIFICATE OF CORRECTION

| | |
|---|---|
| PATENT NO. | : 7,592,590 B2 |
| APPLICATION NO. | : 10/550177 |
| DATED | : September 22, 2009 |
| INVENTOR(S) | : Frosien |

It is certified that error appears in the above-identified patent and that said Letters Patent is hereby corrected as shown below:

Column 15, Line 23, please delete "SB-deflection" and insert --4-B-deflection-- therefor.

Signed and Sealed this

Tenth Day of November, 2009

David J. Kappos
*Director of the United States Patent and Trademark Office*